US012635522B2

(12) United States Patent
Ströbel-Maier et al.

(10) Patent No.: US 12,635,522 B2
(45) Date of Patent: May 19, 2026

(54) ELECTRONIC COMPONENT COOLER

(71) Applicant: Danfoss Silicon Power GmbH, Flensburg (DE)

(72) Inventors: Henning Ströbel-Maier, Wanderup (DE); Karsten Lund, Sieverstedt (DE)

(73) Assignee: DANFOSS SILICON POWER GMBH, Flensburg (DE)

( * ) Notice: Subject to any disclaimer, the term of this patent is extended or adjusted under 35 U.S.C. 154(b) by 409 days.

(21) Appl. No.: 18/555,752

(22) PCT Filed: Apr. 22, 2022

(86) PCT No.: PCT/EP2022/060756
§ 371 (c)(1),
(2) Date: Oct. 17, 2023

(87) PCT Pub. No.: WO2022/229031
PCT Pub. Date: Nov. 3, 2022

(65) Prior Publication Data
US 2024/0213117 A1      Jun. 27, 2024

(30) Foreign Application Priority Data

Apr. 25, 2021      (DK) .............................. PA202100409

(51) Int. Cl.
*H10W 40/47* (2026.01)
*H05K 7/20* (2006.01)

(52) U.S. Cl.
CPC ........ *H10W 40/47* (2026.01); *H05K 7/20254* (2013.01)

(58) Field of Classification Search
CPC .......................... H10W 40/47; H05K 7/20254
See application file for complete search history.

(56) References Cited

U.S. PATENT DOCUMENTS

2010/0296247 A1      11/2010      Chang et al.

FOREIGN PATENT DOCUMENTS

| EP | 3 352 216 A1 | 7/2018 |
| JP | 2011108891 A * | 6/2011 |

OTHER PUBLICATIONS

International Search Report mailed on Sep. 8, 2022, in connection with corresponding International Application No. PCT/EP2022/060756; 3 pages.

* cited by examiner

*Primary Examiner* — Eric S Ruppert
(74) *Attorney, Agent, or Firm* — McCormick, Paulding & Huber PLLC

(57) ABSTRACT

A coolant coupling device wherein the cooler includes a cavity wherein the coolant trajectory is altered by an angle of greater than 75 degrees and which is defined by a wall structure incorporating two radii.

16 Claims, 5 Drawing Sheets

ELECTRONIC COMPONENT COOLER

CROSS-REFERENCE TO RELATED APPLICATIONS

This application is a National Stage application of International Patent Application No. PCT/EP2022/060756, filed on Apr. 22, 2022, which claims priority to Danish Patent Application No. PA202100409, filed on Apr. 25, 2021, each of which is hereby incorporated by reference in its entirety.

TECHNICAL FIELD

The invention described below relates to a coolant coupling device, especially for liquid cooling of power semiconductors.

BACKGROUND

Semiconductor devices generate heat during their operation, and this heat usually acts to degrade the operation of the semiconductor device. For power semiconductor devices is necessary to be cooled during operation to maintain acceptable device performance, and for high power semiconductors fluid cooling is often applied.

A typical prior art device is shown in FIG. 1 where three electronic power modules 2 are mounted on an electronic component cooler 1. The cooler 1 is cooled by a coolant fluid.

FIG. 2 shows the underside of the typical prior art device shown in FIG. 1. The electronic power modules 2 are not visible in this figure, since they now lie on the hidden surface of the cooler 1.

The cooler 1 is shown here dissembled into a first part 1*a* which contains a set of passages 7 suitable for distributing the coolant in a controlled way to allow even cooling of the cooled surface. The second part 1*b* acts as a lid for closing these passages and is shown here removed for the purposes of clarity. A coolant inlet 3 and a coolant outlet 4 are shown affixed to the lid and feed respectively in to and out of an inlet cavity 5 and outlet cavity 6 of the main part 1*a* of the cooler. The cooler 1 is cooled by a coolant which passes in through the inlet 3, and leaves the cooler through the outlet 4. In many installations, the coolant is cooled by external equipment (not shown here) and recycled to the inlet 3.

FIG. 3 shows a detail of the outlet cavity 6 of the main part 1*a* shown in FIG. 2. The individual passages 7 which directed the coolant fluid passed the areas where the power modules are attached are shown, together with arrows 8 indicating the flow of coolant. The multiple parallel coolant flows are reunited before they enter the outlet cavity 6, and then they will eventually flow out through the outlet 4. The outlet 4 has an axis which is at 90° and offset from the flow of coolant into the outlet cavity 6. Whilst it travels through the cavity 6 the coolant is forced to change direction by 90° as it changes from travelling along the cooler 1*a* to exiting from the cooler through the vertical outlet 4. In such a square cavity, this is likely to lead to sudden changes in direction of the fluid which may cause significant backpressure in the system, which in turn leads to energy loss and the need for larger and more expensive pumping systems to circulate the coolant fluid.

Although some losses must be expected when turning a fluid flow from the entry 9 of the outlet cavity a full 90° to the outlet 4, it would be of great benefit if such losses were minimised.

Cooling systems are often constrained by the necessity to fit into existing equipment or to be placed in relation to other equipment in a confined space such as is found in the engine compartment of a vehicle, and such constraints may include that a coolant passage has to be turned through a large angle or at such an angle with an offset.

SUMMARY

It would be of great benefit if the flow through a coolant coupler where the direction of flow is changed by 90° is controlled in such a way to minimise sudden changes of direction, turbulence, or other chaotic movements which lead to increased flow resistance.

It has been found, through diligent experimentation and modelling, that with the careful design of the internal space of such a coupling, the pressure loss can be minimised with the great advantages that that achieves.

It is, thus, an object of the present invention to provide a coolant coupler device comprising a cavity wherein the coolant trajectory is altered by 90° in a manner which involves smoother flow changes than that shown by prior art coolant couplers.

It is an additional object of the present invention to provide an electronic component cooler with improved efficiency over prior art electronic power devices.

It is a further additional object of the present invention to provide an electronic power device with improved efficiency over prior art electronic power devices.

According to a first aspect of the present invention the above and other objects are fulfilled by providing a coolant coupler comprising a cavity wherein the coolant trajectory is altered by an angle of greater than 75 degrees, comprising a first portal with a width LP1 and which communicates with a first coolant channel with a first axis and a second portal communicating with a second coolant channel with a with second axis, the first axis and the second axis being at right angles to each other, but displaced by a distance X, the cavity being defined by a wall having a first section beginning at the first portal and which continues in parallel with the first axis for a distance L1, a second section which starts at the end of the first section and which curves into the cavity with a radius R1, a third section which begins at the opposite side of the first portal than the first section and which continues at right angles to the first axis for a distance L3, a fourth section which starts at the end of the third section and which curves into the cavity with a radius R2, and a fifth section which forms a tangent between the second and fourth wall segments wherein the second portal has a dimension of LP2 and is positioned so that it lies directly over the cavity with one edge directly above a point of the fifth wall section, and wherein R1>R2.

The angle by which the coolant trajectory is altered may, in a preferred embodiment, be within 10 degrees of a right angle, and in a more preferred embodiment the angle may be a right angle.

By coolant coupler is understood a device comprising a coolant inlet and a coolant outlet and through which coolant flows, the coolant coupler altering the trajectory of the coolant so that the coolant leaves the coolant coupler in a different direction than it entered, and at a specific offset. Such a coolant coupler may be necessary for enabling an electronic device to be cooled by pre-existing coolant supplies, available, for example, within the engine compartment of an electric vehicle.

In a preferred embodiment of the invention L1 is greater than 0.8×LP1 and less than 1.2×LP1, in particular greater than 0.9×LP1 and less than 1.1×LP1.

In another embodiment of the invention R1 is greater than 0.8×LP1 and less than 1.2× LP1, in particular greater than 0.9×LP1 and less than 1.1×LP1.

In yet another embodiment of the invention R2 is defined by the following formula:

$$R2 = a \times LP1 - b \times L3$$

where a is between 1 and 3, and b is between 0.2 and 1.

In a preferred embodiment of the invention LP2 greater than 0.8×LP1 and less than 1.2×LP1.

According to a second aspect of the present invention the above and other objects are fulfilled by providing an electronic component cooler comprising a cavity wherein the coolant trajectory is altered by an angle of greater than 75 degrees, comprising a first portal with a width LP1 and which communicates with a first coolant channel with a first axis and a second portal communicating with a second coolant channel with a with second axis, the first axis and the second axis being at right angles to each other, but displaced by a distance X, the cavity being defined by a wall having a first section beginning at the first portal and which continues in parallel with the first axis for a distance L1, a second section which starts at the end of the first section and which curves into the cavity with a radius R1, a third section which begins at the opposite side of the first portal than the first section and which continues at right angles to the first axis for a distance L3, a fourth section which starts at the end of the third section and which curves into the cavity with a radius R2, and a fifth section which forms a tangent between the second and fourth wall segments wherein the second portal has a dimension of LP2 and is positioned so that it lies directly over the cavity with one edge directly above a point of the fifth wall section, and wherein R1>R2.

According to a third aspect of the present invention the above and other objects are fulfilled by providing an electronic power device comprising one or more semiconductor power modules attached to an electronic component cooler comprising a cavity wherein the coolant trajectory is altered by an angle of greater than 75 degrees, comprising a first portal with a width LP1 and which communicates with a first coolant channel with a first axis and a second portal communicating with a second coolant channel with a with second axis, the first axis and the second axis being at right angles to each other, but displaced by a distance X, the cavity being defined by a wall having a first section beginning at the first portal and which continues in parallel with the first axis for a distance L1, a second section which starts at the end of the first section and which curves into the cavity with a radius R1, a third section which begins at the opposite side of the first portal than the first section and which continues at right angles to the first axis for a distance L3, a fourth section which starts at the end of the third section and which curves into the cavity with a radius R2, and a fifth section which forms a tangent between the second and fourth wall segments wherein the second portal has a dimension of LP2 and is positioned so that it lies directly over the cavity with one edge directly above a point of the fifth wall section, and wherein R1>R2.

BRIEF DESCRIPTION OF THE DRAWINGS

The invention will become more fully understood from the detailed description given herein below. The accompanying drawings are given by way of illustration only, and thus, they are not limitative of the present invention. In the accompanying drawings.

DETAILED DESCRIPTION

Figure 1:
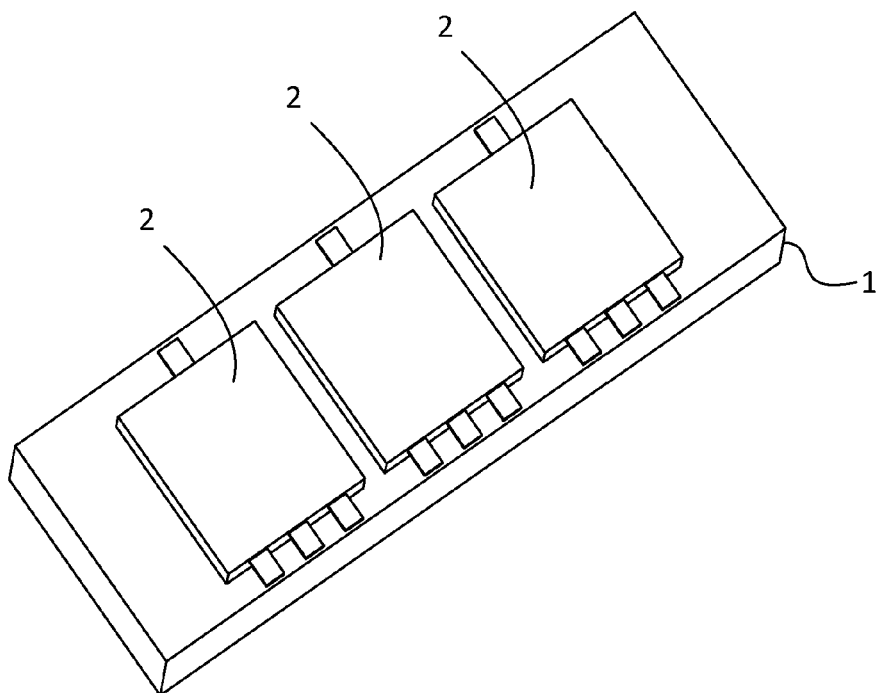
FIG. 1 shows a typical prior art device.
Figure 2:
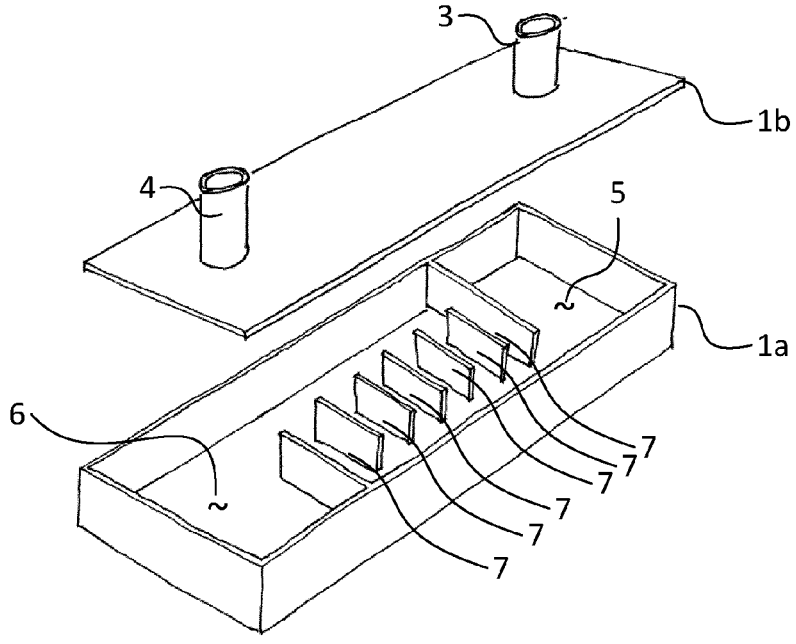
FIG. 2 shows the underside of the typical prior art device shown in FIG. 1.
Figures 3, 4:
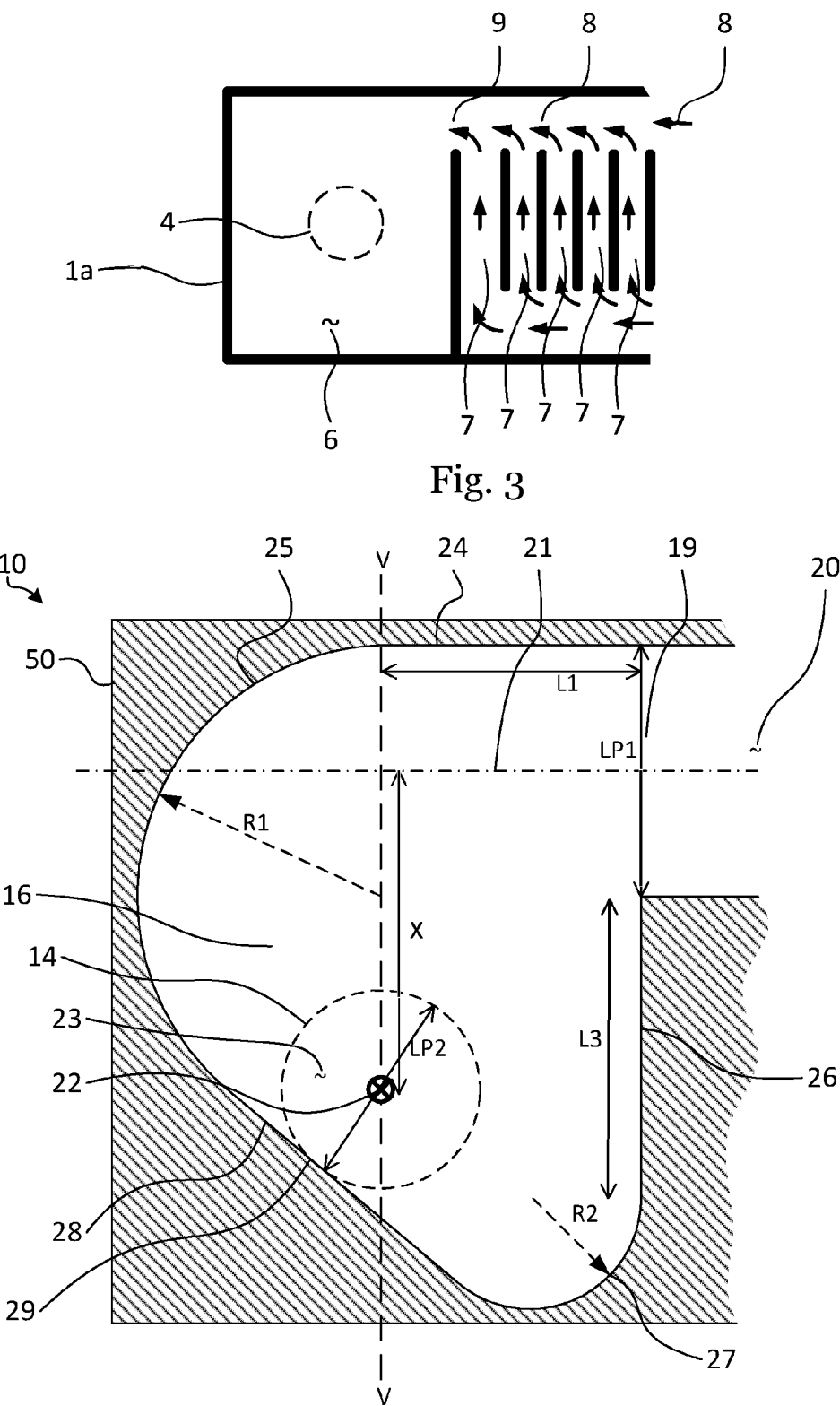
FIG. 3 shows a detail of the outlet cavity of the device shown in FIG. 2.
FIG. 4 shows a preferred embodiment of the invention.

Referring now in detail to the drawings for the purpose of illustrating preferred embodiments of the present invention, a first embodiment of the inventive coolant coupler 50 forming part of an electronic component cooler 10 is shown in FIG. 4.

In FIG. 4 is shown in a preferred embodiment of the coolant coupler 50 forming part of an electronic component cooler 10, in particular the outlet cavity 16 of such a coolant coupler. The inlet cavity (not shown) is mounted at the opposite end of the cooler 10, and has an identical form, apart from being reversed in the vertical direction. Fluid entering the outlet cavity 16 continues in the same direction that it has had in a first coolant channel 20, that is along the axis 21 of the first coolant channel 20, until it meets the gently curving section of wall 25 which gradually begins to turn the flow direction into the cavity 16. This gradual change in velocity, as opposed to the much faster direction change that occurs in prior art cavities, has a number of advantages. One is that less energy is it expended in causing turbulence or useless changes in direction. This allows more efficient pumping of coolant fluid through the system, and saves energy. Another advantage is that this slow changing direction begins to enhance a rotation within the fluid itself which continues for the rest of the path within the cooler. In particular, it enhances the circulation of fluid as it passes upwards into the second portal 14 and thus into the second coolant channel 23 and finally out of the cooler 10.

Such an advantageous flow, it has been found, it can be enhanced by dimensioning the cavity in the following manner.

If the first portal 19 has a dimension denoted as LP1, then the first section of wall 24 starts at one side of the first portal 19 and is parallel with the axis 21 of the first coolant channel. The first section of wall 24 in this embodiment has the same dimension LP1 as the width of the first portal 19.

At the end of the first section of wall 24, of the second section 25 of the wall begins to gently turn inwards with a radius R1. In this embodiment, the radius R1 has the same dimension LP1 as the width of the first portal 19. At the end of the second section 25 of the wall, and essentially straight fifth section 28 of the wall begins. This passes almost exactly under one edge of the second portal opening 14 and eventually begins to gently curve inwards at the fourth section 27 of the wall which has a radius R2. The fourth section of the wall 27 eventually meets the third section of the wall 26 which is now running at right angles to the axis 21 of the first coolant channel 20. The third section of the wall 26 terminates at the opposite side of the first portal from the start of the first section of the wall 24. The radius of the fourth section of the wall 27 enhances the rotational nature of the flow of the coolant within the outlet cavity 16. It is of advantage if the radius R1 is larger than the radius R2.

It has been found that the length of the first wall section 24 can, with advantage, be constructed to be similar to that of the width of the first portal 19, denoted here as LP1. The preferred value of L1 lies in the range:

$$0.8 \times LP1 < L1 < 1.2 \times LP1,$$

and an even more preferred value of L1 lies in the range:

$$0.9 \times LP1 < L1 < 1.1 \times LP1.$$

Similarly, it is been found that the radius R1 can, with advantage, be constructed to be similar to the width of the first portal 19, denoted here as LP1. The preferred value of R1 lies in the range:

$$0.8 \times LP1 < R1 < 1.2 \times LP1,$$

and an even more preferred value of R1 lies in the range:

$$0.9 \times LP1 < R1 < 1.1 \times LP1.$$

It is also been found that the optimum radius R2 of the fourth section of wall is dependent upon how far from the second portal 14 the fourth section of wall begins. The preferred value of R2 has been found to lie in the ranges determined from the following equation:

$$R2 = a \times LP1 - b \times L3,$$

where 2<a<3 and 0.2<b<1.

Figure 5:
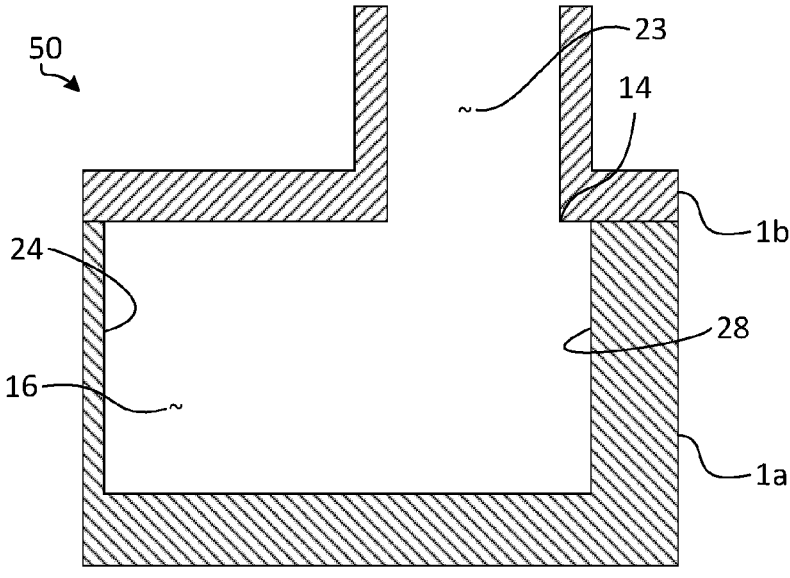
FIG. 5 shows a cross section V-V of the embodiment shown in FIG. 4.

FIG. 5 shows a cross section V-V of the embodiment shown in FIG. 4.

Figure 6:
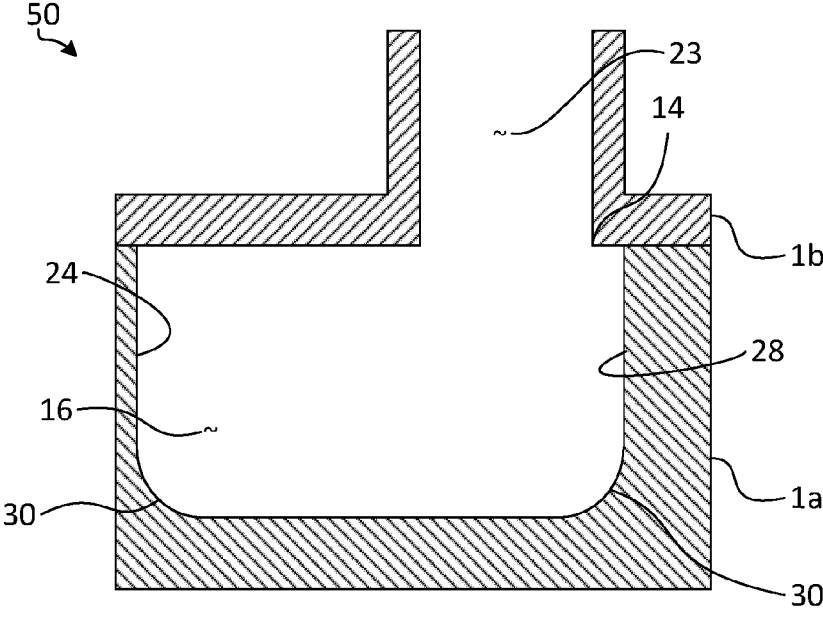
FIG. 6 shows another embodiment of the invention.

FIG. 6 shows another embodiment of the invention. In this embodiment, the joint between the wall segments 24, 28 and the floor segments of the outlet cavity 16 are smoothed 30 to avoid sharp changes in velocity for the circulating coolant within cavity.

Figure 7:
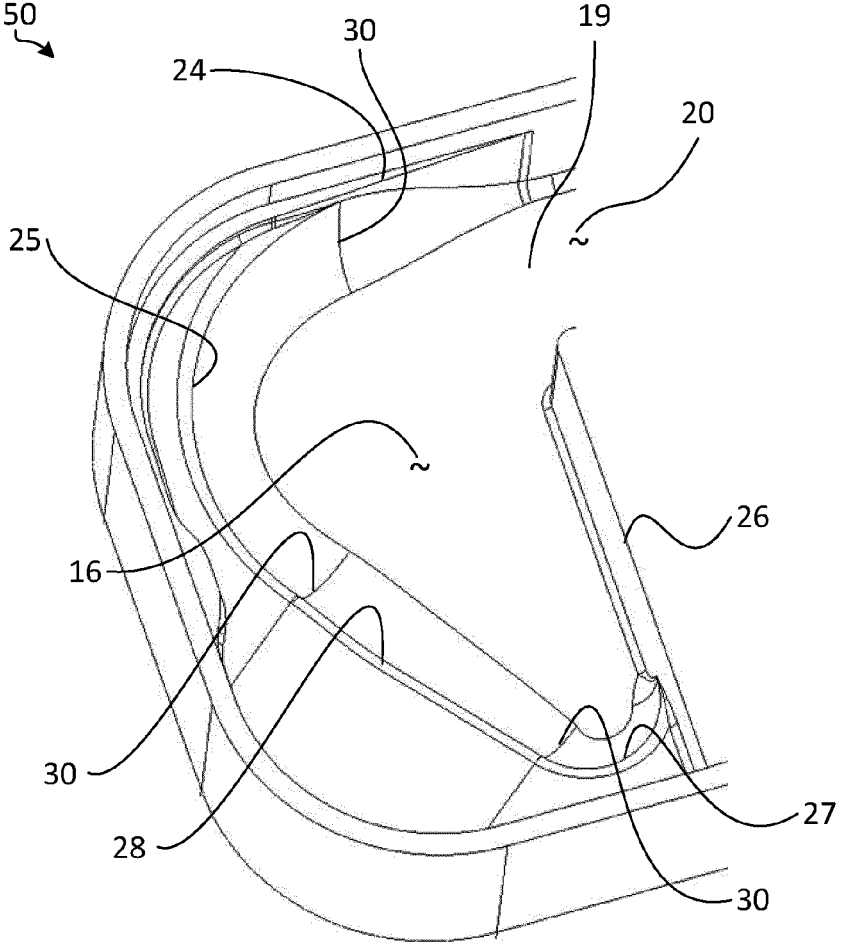
FIG. 7 shows a perspective view of a third embodiment of the invention.

FIG. 7 is a perspective view of a third embodiment of the invention.

Figure 8:
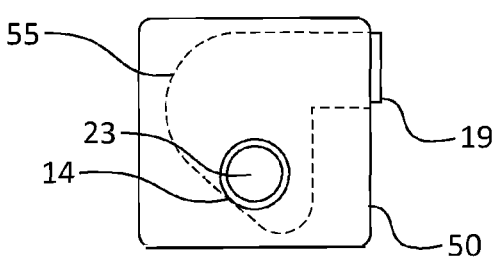
FIG. 8 shows a representative view of an embodiment of the inventive coolant coupler.

FIG. 8 is a representative view of an embodiment of the inventive coolant coupler 50. The hatched line 55 shows the outline of the wall within the coolant coupler which defines the outlet cavity 16. Fluid enters the outlet cavity 16 through the first portal 19. After travelling thorough the coolant coupler 50, the coolant leaves the coolant coupler through the second portal 14.

Figure 9:
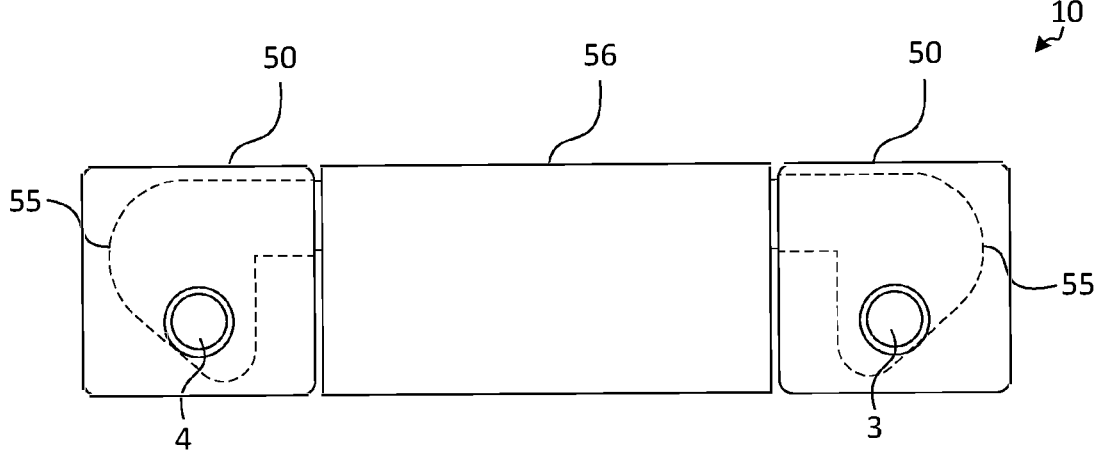
FIG. 9 shows a representative view of an electronic component cooler comprising an embodiment of the inventive coolant coupler.

FIG. 9 is a representative view of an electronic component cooler 10 comprising an embodiment of the inventive coolant coupler 50. Here the main body 56 of the electronic component cooler 10 is attached to two coolant couplers 50; one acting to couple coolant entering the main body 56 via the coolant inlet 3 and a second acting to couple coolant leaving the main body 56 to the coolant outlet 4. The cavities within each of the two coolant couplers 50 are shown by the hatched lines 55. Note that the coolant couplers 50 on the inlet and outlet are essentially the same design, but mirrored.

Figure 10:
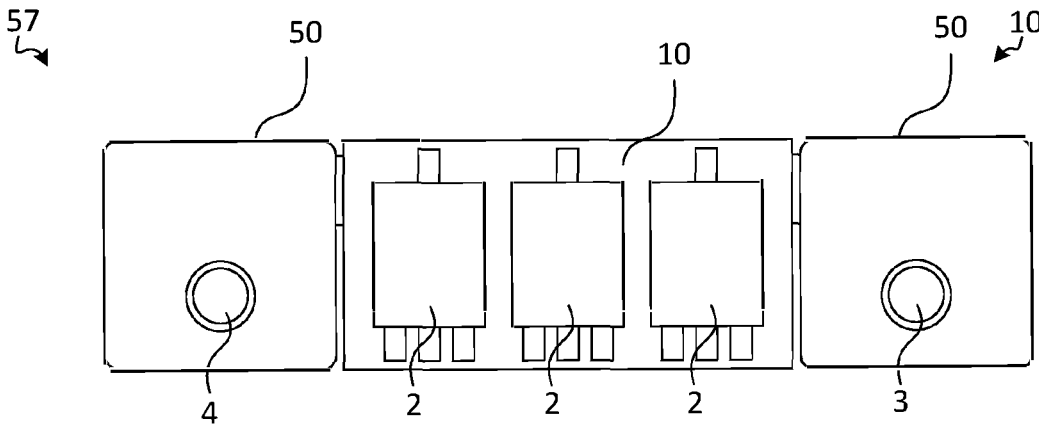
FIG. 10 shows a representative view of an electronic power device comprising an embodiment of the inventive coolant coupler.

FIG. 10 is a representative view of an electronic power device 57 comprising an embodiment of the inventive coolant coupler. Here three electronic power modules 2 are mounted on an electronic cooler 10 similar to that shown in FIG. 9.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. A coolant coupler comprising a cavity wherein the coolant trajectory is altered by an angle of greater than 75 degrees, comprising
 a first portal with a width LP1 and which communicates with a first coolant channel with a first axis and
 a second portal communicating with a second coolant channel with a with second axis, the first axis and the second axis being at right angles to each other, but displaced by a distance X,
 the cavity being defined by a wall having
 a first section beginning at the first portal and which continues in parallel with the first axis for a distance L1,
 a second section which starts at the end of the first section and which curves into the cavity with a radius R1,
 a third section which begins at the opposite side of the first portal than the first section and which continues at right angles to the first axis for a distance L3,
 a fourth section which starts at the end of the third section and which curves into the cavity with a radius R2, and
 a fifth section which forms a tangent between the second and fourth wall segments wherein the second portal has a dimension of LP2 and is positioned so that it lies directly over the cavity with one edge directly above a point of the fifth wall section,
 and wherein R1>R2.

2. The coolant coupler according to claim 1, wherein L1 is greater than 0.8×LP1 and less than 1.2×LP1.

3. The coolant coupler according to claim 1, wherein R1 is greater than 0.8×LP1 and less than 1.2×LP1.

4. The coolant coupler according to claim 1, wherein R2 is defined by the following formula:

$$R2 = a \times LP1 - b \times L3$$

where a is between 1 and 3, and b is between 0.2 and 1.

5. The coolant coupler according to claim 1, wherein LP2 greater than 0.8×LP1 and less than 1.2×LP1.

6. An electronic component cooler comprising the coolant coupler according to claim 1.

7. An electronic power device comprising one or more semiconductor power modules attached to the electronic component cooler according to claim 6.

8. The coolant coupler according to claim 2, wherein R2 is defined by the following formula:

$$R2 = a \times LP1 - b \times L3$$

where a is between 1 and 3, and b is between 0.2 and 1.

9. The coolant coupler according to claim 3, wherein R2 is defined by the following formula:

$$R2 = a \times LP1 - b \times L3$$

where a is between 1 and 3, and b is between 0.2 and 1.

10. The coolant coupler according to claim 2, wherein LP2 greater than 0.8×LP1 and less than 1.2×LP1.

11. The coolant coupler according to claim 3, wherein LP2 greater than 0.8×LP1 and less than 1.2×LP1.

12. The coolant coupler according to claim 4, wherein LP2 greater than 0.8×LP1 and less than 1.2×LP1.

13. An electronic component cooler comprising the coolant coupler according to claim 2.

14. An electronic component cooler comprising the coolant coupler according to claim 3.

15. An electronic component cooler comprising the coolant coupler according to claim 4.

16. An electronic component cooler comprising the coolant coupler according to claim 5.

\* \* \* \* \*